United States Patent
Gururajarao et al.

(10) Patent No.: US 7,639,056 B2
(45) Date of Patent: Dec. 29, 2009

(54) ULTRA LOW AREA OVERHEAD RETENTION FLIP-FLOP FOR POWER-DOWN APPLICATIONS

(75) Inventors: Sumanth Katte Gururajarao, Dallas, TX (US); Hugh T. Mair, Fairview, TX (US); David B. Scott, Plano, TX (US); Uming Ko, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/138,788

(22) Filed: May 26, 2005

(65) Prior Publication Data

US 2006/0267654 A1    Nov. 30, 2006

(51) Int. Cl.
H03K 3/289 (2006.01)
H03K 3/356 (2006.01)
(52) U.S. Cl. .................................. 327/202; 327/203
(58) Field of Classification Search .................. None
See application file for complete search history.

(56) References Cited

U.S. PATENT DOCUMENTS

| | | | |
|---|---|---|---|
| 6,433,586 B2 * | 8/2002 | Ooishi | 326/93 |
| 6,762,638 B2 * | 7/2004 | Correale et al. | 327/202 |
| 6,870,412 B2 * | 3/2005 | Cho | 327/202 |
| 7,123,068 B1 * | 10/2006 | Hoover et al. | 327/202 |
| 2004/0008071 A1 | 1/2004 | Ko et al. | |
| 2004/0051574 A1 | 3/2004 | Ko et al. | |
| 2005/0218952 A1 * | 10/2005 | Padhye et al. | 327/218 |

OTHER PUBLICATIONS

V. Zyuban, et al., "Low Powered Integrated Scan-Retention Mechanism", ISPLED 2002, Aug. 12-14, 2002, Monterey, California (Copyrighted Paper).
Shigematsu, et al., "A 1-V High-Speed MTCMOS Circuit Scheme for Power-Down Application Circuits", IEEE Journal of Solid-State Circuits, vol. 32, No. 6, Jun. 1997.

* cited by examiner

Primary Examiner—Tuan Lam
(74) Attorney, Agent, or Firm—Wade J. Brady, III; Frederick J. Telecky, Jr.

(57) ABSTRACT

In a method and system for data retention, a data input is latched by a first latch. A second latch coupled to the first latch receives the data input for retention while the first latch is inoperative in a standby power mode. The first latch receives power from a first power line that is switched off during the standby power mode. The second latch receives power from a second power line. A controller receives a clock input and a retention signal and provides a clock output to the first latch and the second latch. A change in the retention signal is indicative of a transition to the standby power mode. The controller continues to hold the clock output at a predefined voltage level and the second latch continues to receive power from the second power line in the standby power mode, thereby retaining the data input.

13 Claims, 3 Drawing Sheets

United States Patent US 7,639,056 B2

ULTRA LOW AREA OVERHEAD RETENTION FLIP-FLOP FOR POWER-DOWN APPLICATIONS

BACKGROUND

The present disclosure relates generally to integrated circuits (ICs), and more particularly to a system and method for providing data retention with reduced power consumption.

Many portable electronic devices such as cellular phones, digital cameras/camcorders, personal digital assistants, laptop computers and video games operate on batteries. During periods of inactivity the device may not perform processing operations and may be placed in a power-down or standby power mode to conserve power. Power provided to ICs within the electronic device may be turned off in a standby power mode. However, presence of leakage current during the standby power mode represents a challenge for designing portable, battery operated devices. Data retention circuits such as flip-flops and/or latches within the device may be used to store status information for later use prior to the device entering the standby power mode. The data retention latch, which may also be referred to as a shadow latch or a balloon latch, is typically powered by a separate 'always on' power supply.

A known technique for reducing leakage current during periods of inactivity utilizes multi-threshold CMOS (MTCMOS) technology to implement the shadow latch. In this approach, the shadow latch utilizes thick gate oxide transistors and/or high threshold voltage ($V_t$) transistors to reduce the leakage current in standby power mode. The shadow latch is typically detached from the rest of the circuit during normal operation (e.g., during an active power mode) to maintain performance. To retain data in a 'master-slave' flip-flop topology, a third latch, e.g., the shadow latch, is added to the master latch and the slave latch for the data retention.

Some of the MTCMOS technology based data retention techniques such as the shadow latch are described in further detail in the following technical papers and U.S. patent applications, which are hereby incorporated herein by reference into this specification: 1) "Low Powered Integrated Scan-Retention Mechansim", V. Zyuban, et al., ISPLED 2002, Aug. 12-14, 2002, Monterey, Calif. (Copyrighted Paper), 2) "A 1-V High-Speed MTCMOS Circuit Scheme for Power-Down Application Circuits", Shigematsu, et al., IEEE Journal of Solid-State Circuits, Volume 32, No. 6, June 1997, 3) US Patent Application No. 20040051574, Ko Uming, et al., entitled 'Retention Register With Normal Functionality Independent Of Retention Power Supply', and 4) US Patent Application No. 20040008071, Ko Uming, et al., entitled 'Retention Register For System-Transparent State Retention'.

However, known techniques for data retention such as use of the shadow latch may result in an increased area and increased cost per flip-flop. The additional area needed for the shadow latch per flip flop is magnified at the chip level when a very large number of data retention flip-flops may be used. In addition, the shadow latch may not be able to operate at lower operating voltages. Due to the higher threshold voltage ($V_t$) of the shadow latch transistors, transferring flip-flop data in and out of the shadow latch may get slower as the supply voltage is lowered.

Therefore, a need exists to provide an improved method and system for providing data retention with reduced power consumption in a standby power mode. Additionally, a need exists to reduce the area overhead associated with the data retention flip-flop. Furthermore, a need exists to operate the data retention flip-flop with a scalable supply voltage.

Accordingly, it would be desirable to provide an improved data retention flip-flop, absent the disadvantages found in the prior techniques discussed above.

SUMMARY

The foregoing need is addressed by the teachings of the present disclosure, which relates to a data retention apparatus having reduced area overhead. According to one embodiment, in a method and system for data retention, a data input is latched by a first latch. A second latch coupled to the first latch receives the data input for retention while the first latch is inoperative in a standby power mode. The first latch receives power from a first power line that is switched off during the standby power mode. The second latch receives power from a second power line. A controller receives a clock input and a retention signal and provides a clock output to the first latch and the second latch. A change in the retention signal is indicative of a transition to the standby power mode. The controller continues to hold the clock output at a predefined voltage level and the second latch continues to receive power from the second power line in the standby power mode, thereby retaining the data input.

In one embodiment, a data retention device includes a first active region having a first type ion implantation and a second active region having a second type ion implantation. The first active region includes a first group of transistors of a first conductive type with each one of the transistors being powered by a first power source in a standby power mode. The second active region includes a second group of transistors of a second conductive type with each one of the transistors in the second group being powered by a second power source that is switched off in the standby power mode. In a particular embodiment, the first active region is a single N-well region and the first conductive type of transistor is a PMOS transistor. An area overhead associated with the single N-well region is approximately 10% greater compared to a device without data retention.

Several advantages are achieved by the method and system according to the illustrative embodiments presented herein. The embodiments advantageously provide for an improved data retention technique with a reduced area overhead, reduced power consumption, reduced cost and operability in a scalable supply voltage environment. This advantageously enables manufacturers to reduce the die size of circuits having data retention and extend the battery life of portable electronic devices.

DETAILED DESCRIPTION

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Many traditional data retention flip-flops based on MTC-MOS technology utilize a third latch for the data retention. This technique results in an increased area per flip-flop and may result in a very large increase in the die area depending on the number of data retention flip-flops used in the chip. In addition, the shadow latch may not be able to work with scalable voltage supplies used in power saving devices. These problems may be addressed by an improved data retention technique having reduced area overhead per flip-flop and operability in scalable, lower voltage environments. In the improved data retention system and method, a data input is saved in a slave latch, which is used as a shadow latch, before switching to a standby power mode. The slave latch continues to receive power in the standby mode and a clock signal provided to the slave latch is held at a predefined level in the standby power mode to retain the data input.

According to one embodiment, in a method and system for data retention, a data input is latched by a first latch. A second latch coupled to the first latch receives the data input for retention while the first latch is inoperative in a standby power mode. The first latch receives power from a first power line that is switched off during the standby power mode. The second latch receives power from a second power line. A controller receives a clock input and a retention signal and provides a clock output to the first latch and the second latch. A change in the retention signal is indicative of a transition to the standby power mode. The controller continues to hold the clock output at a predefined voltage level and the second latch continues to receive power from the second power line in the standby power mode, thereby retaining the data input.

Figure 1:
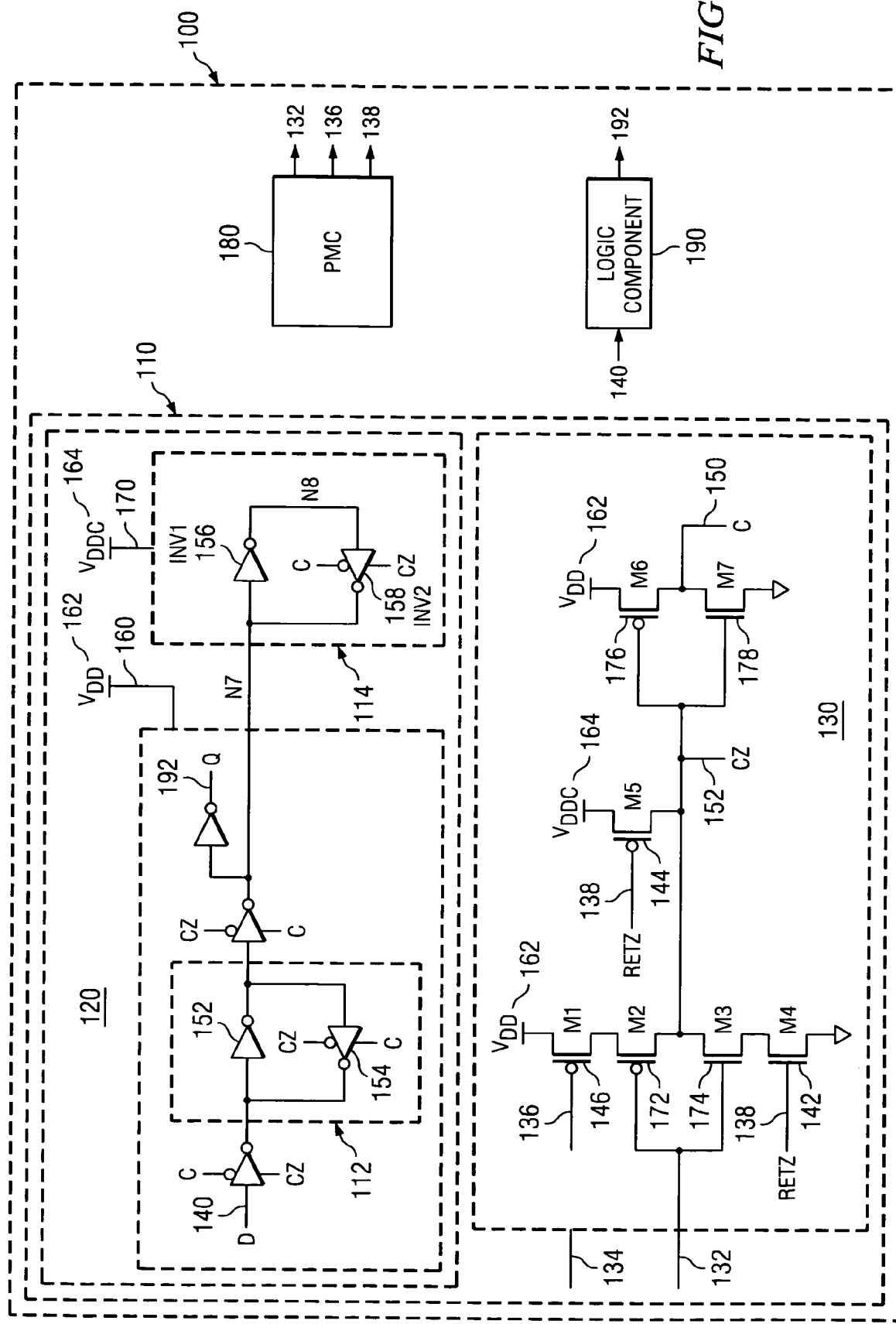
FIG. 1 illustrates a block diagram of an improved portable electronic device having data retention, according to an embodiment.

FIG. 1 illustrates a block diagram of an improved portable electronic device 100 having data retention, according to an embodiment. In the depicted embodiment, the electronic device 100 includes a logic component 190 for performing at least one predefined function and a power management controller (PMC) 180 for managing power consumption. In a particular embodiment, the device 100 is a data processing system such as a cellular phone, a digital camera/camcorder, a personal digital assistant, a laptop computer and a video game box and the device 100 may include one chip, e.g., SoC, and/or may include multiple chips such as microprocessors, digital signal processors, radio frequency circuits, memory, microcontrollers such as input/output controllers, and the like. A data retention circuit 110 is operable to retain data when the device 100 operates in a power saving mode. The data retention circuit 110 includes a master-slave flip-flop 120 and a controller 130. The master-slave flip-flop 120 includes a first latch 112 formed by a first pair of cross coupled inverters 152 and 154 and a second latch 114 formed by a second pair of cross coupled inverters 156 and 158. The first latch 112 is coupled to receive a data input 140. The second latch 114 provides a data output 192. In a particular embodiment, the logic component 190 may be coupled to the master-slave flip-flop 120 to provide the data input 140 and/or receive the data output 192.

The PMC 180 monitors activity of the device 100. Monitoring activity may include monitoring number of operations processed per unit of time, number and/or type of input/output transactions and the like. The PMC 180 may include hardware and/or software. Depending on the activity level, the PMC 180 may generate a request to change a mode of operation of the device 100 to conserve power. For example, the PMC 180 may monitor the device 100 for periods of inactivity. If the device 100 remains inactive for a predefined time period, then the PMC 180 may request a change from a first power mode to a second power mode, e.g., from an active power mode to a power saving power mode. Similarly, the PMC 180 may detect presence of new activity during a standby power mode and request a change from the power saving mode back to the active power mode. The device 100 and/or some of its components such as the data retention circuit 110 may operate in various power saving modes of operation such as a standby mode, inactivity mode, sleep mode, deep sleep mode, power-down mode, retention mode and the like to conserve power.

In a particular embodiment, the data retention circuit 110 operates in at least two modes of operation. For example, the data retention circuit 110 operates in an active power mode for normal operation and retains data in a power saving mode. That is, a state, e.g., high or low level, of the data input 140 is retained when transitioning from an active power mode to a standby power mode and the data output 192 is restored to the saved state of the data input 140 when transitioning back from the standby power mode to the active power mode.

Unlike a conventional master-slave flip flop, which is typically powered by a single power supply and which does not retain data when the single power supply is removed from the flip-flop, the master-slave flip-flop 120 is powered by a first power line 160 having a $V_{DD}$ 162 supply voltage and a second power line 170 having a $V_{DDC}$ 164 supply voltage. The power lines 160 and 170 may also be referred to as power sources or power supplies. In the depicted embodiment, the first latch 112 is powered by the first power line 160 and the second latch 114 is powered by the second power line 170. In a particular embodiment, both the first power line 160 and the second power line 170 may be derived from a single, system level power source.

In a particular embodiment, both the first power line 160 and the second power line 170 have a scalable supply voltage. That is, the voltage level $V_{DD}$ 162 of the first power line 160 and the voltage level $V_{DDC}$ 164 of the second power line 170 may be varied, e.g., scaled up or down, depending on the application. Thus, during periods of inactivity the voltage level may be scaled down to reduce power consumption.

In the depicted embodiment, the first power line 160 is switchable to an on or off state. That is, the first power line 160 may be switched off in the standby power mode to reduce power consumption and may be switched on again in an active power mode. Any circuits and/or devices powered by the first power line 160, e.g., the first latch 112 and/or the logic component 190, may become inoperable in the standby power mode.

In the depicted embodiment, the second power line 170 provides power that is independent of the power saving mode of operation. That is, the second power line 170 is active, e.g., switched on, during all power modes including the standby power mode and the active power mode. Any circuits and/or devices powered by the second power line 170, such as the second latch 114 and the PMC 180, continue to receive power in the standby power mode.

In the depicted embodiment, the controller 130 receives a clock signal CLK 132, receives a retention signal RET 136 at a retention input 134 and provides a clock output signal C 150 and its inverse signal CZ 152 to control the operation of the master-slave flip-flop 120. In a particular embodiment, when C 150 is set to low and CZ 152 is set to high the first latch 112 is enabled and the second latch 114 is disabled. The first latch 112 monitors the data input 140 and changes its output in accordance with the data input 140. The second latch 114 being disabled, changes to the data input 140 have no effect on the data output 192, which is maintained at the last stored state of the data input 140. As soon as C 150 is set to high and CZ 152 is set to low, the first latch 112 is disabled and the second latch 114 is enabled. The output of the first latch 112 is set to the last input state of the data input 140 when C 150 is set to high. The data output 192 is changed to reflect the output of the first latch 112.

In a particular embodiment, the PMC 180 may perform various power conservation functions such as switch off power supplies and gate clocks to low in response to the request to change the mode of operation of the device 100. For example, the PMC 180 may gate CLK 132 to a low level and may provide a change to the retention input 134 by changing the RET signal 136 from a low level during an active power mode to a high level indicating a transition to a standby mode. In one embodiment, the PMC 180 may also provide a RETZ signal 138, which is an inverse of the RET signal 136. In an exemplary, non-depicted embodiment, the RETZ signal 138 may be generated by the controller 130 in response to receiving the RET signal 136 at the retention input 134. In one embodiment, the PMC 180 may change state of the RET signal 136 to indicate a change in power mode, e.g., changing from a high level during the standby mode to a low level indicating a transition to an active power mode. The CLK 132, which was gated to a low level in a standby power mode, may be released to return to the active power mode. In a particular embodiment, the retention input 134 may receive both the RET signal 136 and the RETZ signal 138 as separate channels or may receive the RET signal 136 when the RETZ signal 138 is generated internally within the controller 130.

In the depicted embodiment, the controller 130 includes 3 additional transistors M4 142 (a first switch), M5 144 (a second switch) and M1 146 (a third switch) for data retention compared to a conventional flip-flop with no data retention, which includes 4 transistors M2 172, M3 174, M6 176 and M7 178. During an active power mode, the RET signal 136 is held low and the RETZ signal 138 is held high and normal flip-flop operation occurs.

In an exemplary, non-depicted embodiment, 2 additional transistors M4 142 (the first switch) and M5 144 (the second switch) are used for data retention compared to a conventional flip-flop with no data retention. That is, in this embodiment, the third switch M1 146 may be excluded to further reduce the area overhead and reduce the cost. The source of M2 172 is coupled to the second power line 170 instead of the first power line 160. Since the second power line 170 may have higher impedance compared to the first power line 160, this embodiment may have a slower response in the active mode of operation.

As described above, when changing mode from an active power mode to a standby mode, the CLK 132 is gated low. The state of the data input 140 is saved/stored in the second latch 114 when CLK 132 is low. The RET signal 136 is set to high and the RETZ signal 138 is set to low. As a result, CZ 152 is set to high and C 150 is set to low. Transistor switch M5 144, which is powered by the second power line 170, is controlled by the RETZ signal 138. In a standby power mode, the RETZ signal 138 is set to low and no current is applied at the gate of M5 144 causing the PMOS switch to conduct.

Thus CZ 152 is set to a predefined voltage level, e.g., high. Thus, CZ 152 continues to be held at the high level and the second power line 170 continues to provide power to the second latch 114 in the standby power mode thereby enabling data retention. The data output 192 is undefined in the standby power mode.

The first power line 160 is switched off in the standby power mode and the first latch 112, M1 146, M2 172, M3 174, M4 142, M6 176, and M7 178 become inoperable. The logic component 190, which is powered by first power line 160, is also inoperable. The data input 140 and CLK 132 are in an undefined state. The switching off of the first power line 160 has no effect on the data retained in the second latch 114.

The PMC 180 may trigger a new request to change the mode of operation of the device 100 in response to an increase in activity. When the device 100 is ready to operate in an active mode, the first power line 160 is switched on. This causes the data output 192 to be restored to the state of the data input 140 retained in the second latch 114. Within a few nanoseconds, the data retention circuit 110 is restored to the same state prior to entering the standby power mode. The RET signal 136 is set to low and the RETZ signal 138 is set to high. The CLK 132, which was gated low in the standby mode, is released and the device 110 resumes operation in the active power mode. Additional details of the data retention circuit 110 such as timing aspects are described with reference to FIG. 2 and layout aspects are described with reference to FIGS. 3A and 3B.

Figure 2:
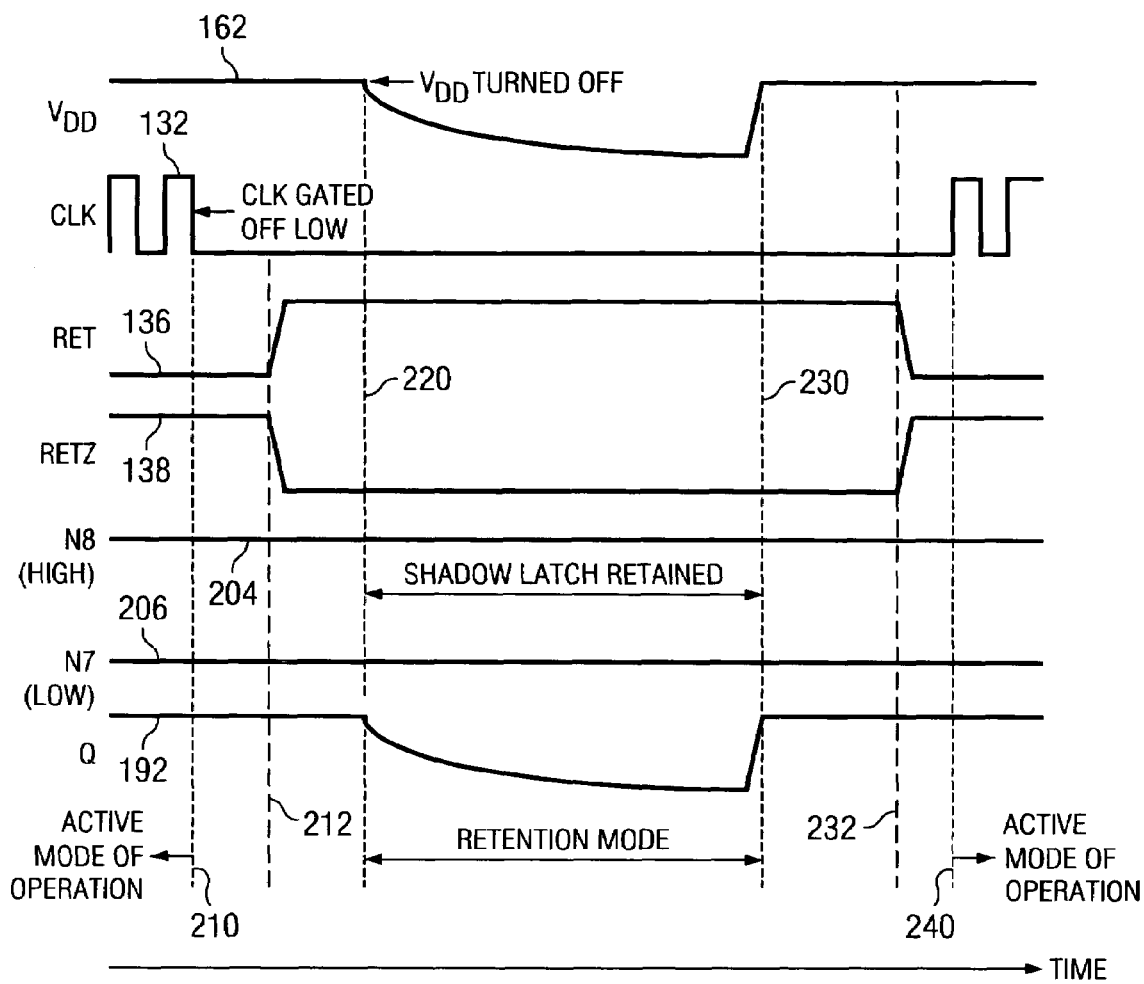
FIG. 2 illustrates waveforms associated with a data retention circuit of FIG. 1, according to one embodiment.

FIG. 2 illustrates waveforms associated with a data retention circuit 110 of FIG. 1, according to one embodiment. In this illustration, at time $t=t_0$ 210, the CLK 132 is gated low and is indicative of a transition from an active power mode to a standby power mode. The data output 192 is held to a high level, which is the state of the data input 140 when CLK 132 is gated to low. Node N7 204 and N8 206 of the second latch 114 are respectively at the low level and the high level. At $t=t_{S1}$ 212, the RET signal 136 is set to a high level and the RETZ signal 138 is set to a low level. At $t=t_1$ 220, the first power line 160 is switched off and a supply voltage $V_{DD}$ 162 decays over time. The data output 192, which is powered by the first power line 160, is undefined and decays over time. The data retention circuit 110 is operating in the standby power mode. At $t=t_2$ 230, the first power line 160 is switched on and the supply voltage $V_{DD}$ 162 is restored to its normal value before being switched off. The data output 192 is set to high, which was the retained state before entering the standby mode. At $t=t_{S2}$ 232, the RET signal 136 is set to low and the RETZ signal 138 is set to high. At $t=t_3$ 240, the CLK 132 which was gated low in the standby mode, is released and is indicative of a completion of transition from the standby power mode to the active power mode.

Figure 3A:
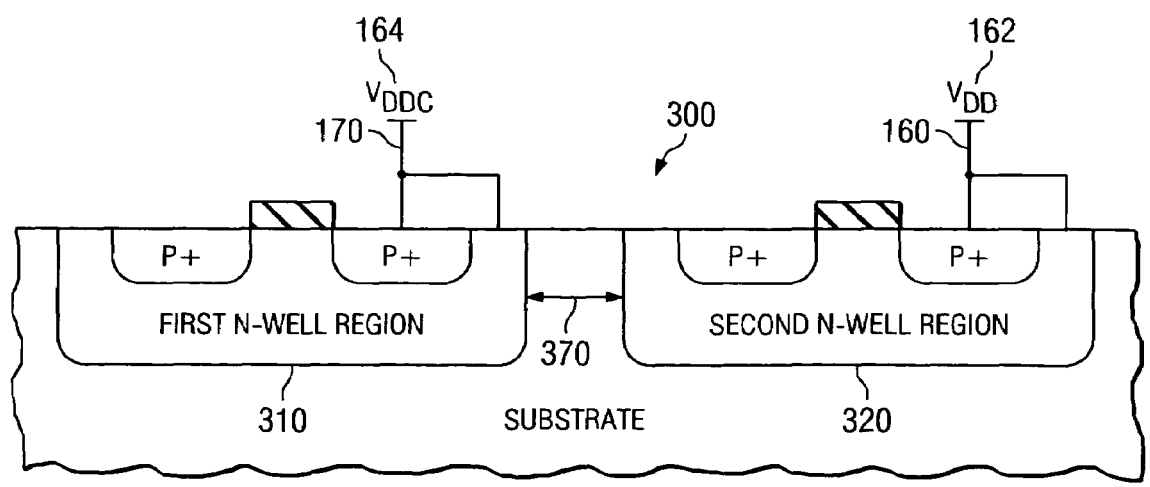
FIG. 3A is an illustrative layout diagram of a cell having split-wells for implementing data retention, according to an embodiment.

FIG. 3A is an illustrative layout diagram of a cell having split-wells for implementing data retention, according to an embodiment. In the depicted embodiment, a cell 300 for implementing at least a portion of the electronic device 100 on a chip includes two active regions 310 and 320 formed over a silicon substrate, with each active region having a first type ion implantation or diffusion. In a particular embodiment, the first active region 310 is a first N-well and the second active region 320 is a second N-well that is different and separate from the first N-well. Transistors of a first conductive type, e.g., PMOS transistors/switches, that are included in the data retention circuit 110 are included in the first active region 310 and are powered by the second power line 170. All other transistors, including NMOS and other PMOS transistors, which are not included in the data retention circuit 110, may be included in the second active region 320 and may be powered by the first power line 160.

In the depicted embodiment, the first active region 310 is biased by $V_{DDC}$ 164 voltage supplied by the second power line 170 for reducing leakage current in the standby power mode. In a particular embodiment, PMOS transistors/switches of the data retention circuit 110 include the first switch M4 142, the second switch M5 144, the third switch M1 146, and PMOS transistors included in gates of the second latch 114. The P+ drain/source region of each of these transistors is also powered by the second power line 170 to reduce the leakage current.

In the depicted embodiment, the second active region 320 is biased by $V_{DD}$ 162 voltage supplied by the first power line 160 which is switched off in the standby power mode for reducing power consumption. The P+ drain/source region of each of these transistors is also powered by the first power line 160. An area overhead associated with a split N-well (or two independent N-wells) implementation may be higher compared to the area overhead associated with a single, integrated N-well implementation due to a minimum separation 370 between the two active regions. Further details of the single N-well implementation are described with respect to FIG. 3B.

Figure 3B:
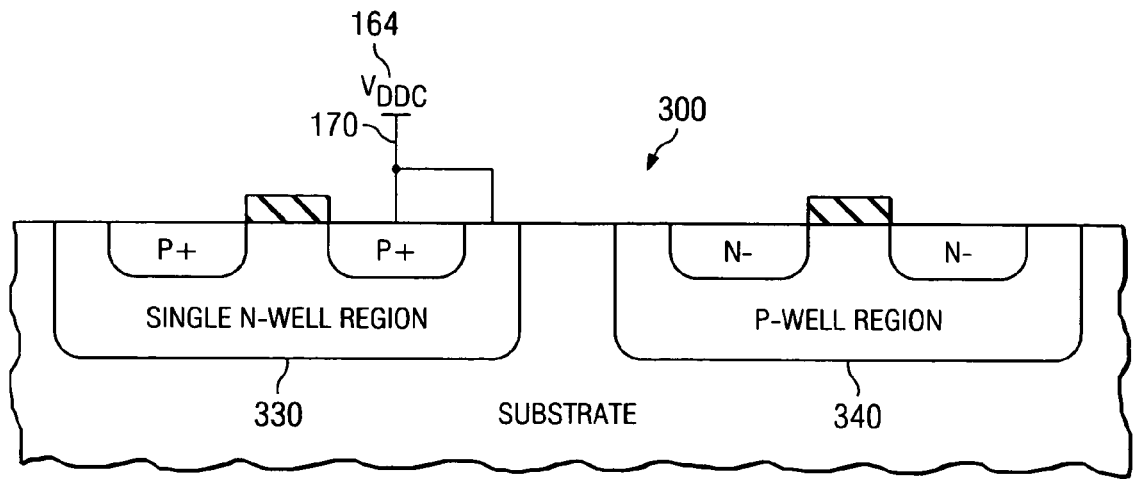
FIG. 3B is an illustrative layout diagram of a cell having an integrated well for implementing data retention, according to an embodiment.

FIG. 3B is an illustrative layout diagram of a cell having an integrated well for implementing data retention, according to an embodiment. In the depicted embodiment, a cell 300 for implementing at least a portion of the electronic device 100 on a chip includes a first active region 330 having a first type ion implantation or diffusion and a second active region 340 having a second type ion implantation or diffusion, with the first and second active regions 330 and 340 being formed over a silicon substrate. In a particular embodiment, the first active region 330 is a single, integrated N-well common to all PMOS transistors in the device 100. This includes, PMOS transistors/switches that are included in the data retention circuit 110 as well as PMOS transistors located elsewhere, such as within the logic component 190. All transistors included in the first active region 330 are powered by the second power line 170. All other transistors, including NMOS but no PMOS transistors, which are included in device 100, may be included in the second active region 320 and may be powered by the first power line 160.

In the depicted embodiment, the first active region 330 is biased by $V_{DDC}$ 164 voltage supplied by the second power line 170. The P+ drain/source region of each of the PMOS transistors is also powered by the second power line 170. In the standby mode $V_{DD}$ 162 will be lower than $V_{DDC}$ 164 voltage, thereby resulting in an additional source of current leakage between the single N-well to the source/drain of PMOS. These leakage currents, which are generally referred to as edge-leakage currents, are typically less compared to sub-threshold and gate leakage currents for most technologies.

An area overhead associated with a single N-well implementation is lower compared to the area overhead associated with a split N-well implementation. In a particular embodiment, a commercially available chip simulation model program and/or a chip layout design tool may be used to calculate layout areas for a circuit. According to one calculation, layout area of the data retention circuit 110 having 3 additional transistors M4 142 (the first switch), M5 144 (the second switch) and M1 146 (the third switch) is approximately 13.27 micron$^2$ and a layout area for a conventional flip-flop having no data retention is approximately 11.59 micron$^2$. Thus, an area overhead associated with the 3 additional transistors is approximately 14.5% higher compared to the conventional flip-flop without the 3 additional transistors and without data retention. Similarly, according to another calculation, an area overhead associated with 2 additional transistor (M4 142 and M5 144) based data retention flip-flop is approximately 10% higher compared to the conventional flip-flop with no data retention.

Figure 4:
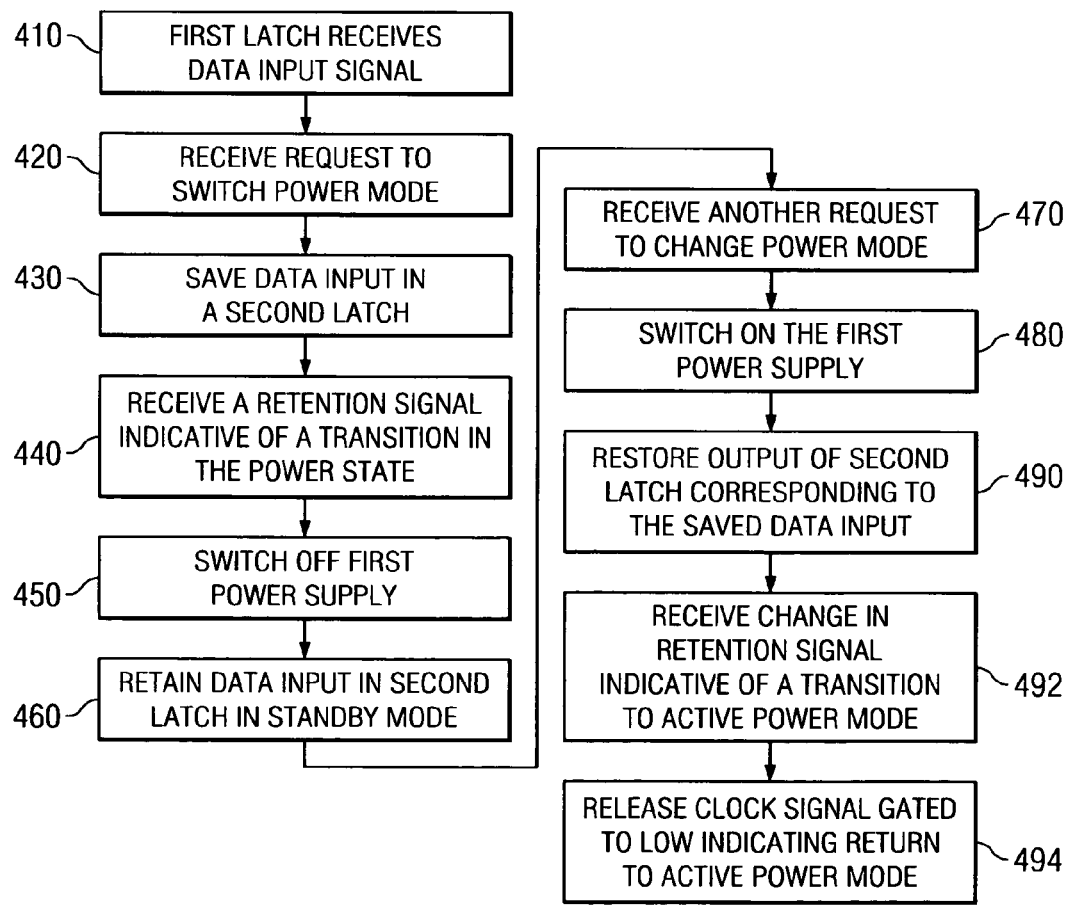
FIG. 4 is a flow chart illustrating a method of retaining data, according to an embodiment.

FIG. 4 is a flow chart illustrating a method of retaining data, according to an embodiment. At step 410, a data input, e.g., the data input 140, is received at a first latch, e.g., the first latch 112. The first latch is powered by a first power supply, e.g., the first power line 160. At step 420, a request is received to switch power mode, e.g., from an active power mode to a standby power mode. At step 430, the data input is saved in a second latch, e.g., the second latch 114, coupled to the first latch with the second latch being powered by a second power supply, e.g., the second power line 170. In a particular embodiment, the data input is saved to the second latch by gating a clock signal, e.g., CLK 132, to a predefined voltage level. At step 440, a retention signal, e.g., RET 136, is received indicative of a transition to the standby power mode. At step 450, the first power source is switched off in response to the assertion of the retention signal. At step 460, the second latch retains the data input in the standby power mode. This is accomplished by maintaining the clock signal at the predefined voltage level in the standby power mode and by the second power source continuing to provide power to the second latch in the standby power mode. At step 470, another request is received to exit the standby power mode, e.g., switch from the standby power mode back to the active power mode. At step 480, the first power source is switched on. At step 490, the restoration of the first power source enables the data input that has been saved in the standby mode to be restored as an output of the second latch. At step 492, the retention signal is changed, which is indicative of an exit from the standby power mode. At step 494, the clock signal gated to the predefined voltage level is released, thereby entering the active power mode.

Various steps described above may be added, omitted, combined, altered, or performed in different orders.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of the device 100 having one or more data retention devices such as the data retention circuit 110, those of ordinary skill in the art will appreciate that the processes disclosed are capable of being implemented using hardware, software, and firmware components including systems-on-a-chip (SoC) or a combination thereof. As another example, even though the data retention circuit 110 has been described in the context of using PMOS transistors, those of ordinary skill in the art will appreciate that the systems and processes disclosed herein are capable of being implemented for use in any semiconductor device.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data retention apparatus comprising:
   a first latch for latching a data input;
   a second latch coupled to the first latch for retaining the data input while the first latch is inoperative in a standby power mode; and
   a controller having a clock input and a retention input, the controller providing a clock output to the first latch and to the second latch, wherein a change in a retention signal received at the retention input is indicative of a transition to the standby power mode, wherein the controller holds the clock output at a predefined voltage level in the standby power mode, and wherein the controller includes:
      a first switch controlled by an inverse of the retention signal, wherein the first switch is inoperative in the standby power mode; and
      a second switch controlled by the inverse of the retention signal, wherein the second switch holds the clock output at the predefined voltage level responsive to the inverse of the retention signal.

2. The data retention apparatus of claim 1, wherein the first latch receives power from a first power line, wherein the second latch receives power from a second power line different than the first power line, wherein each one of the first power line and the second power line has a scalable supply voltage.

3. The data retention apparatus of claim 2, wherein the first power line is switched off responsive to the change in the retention signal, wherein the switch off in the first power line causes the first latch to become inoperative.

4. The data retention apparatus of claim 2, wherein a power management controller (PMC) changes the retention signal in response to a request to change a power mode, wherein the second power line continues to provide power to the PMC in the standby power mode.

5. The data retention apparatus of claim 2, wherein the clock output is held at the predefined voltage level when the first power line is switched off.

6. The data retention apparatus of claim 1, wherein the transition is from an active power mode to the standby power mode.

7. The data retention apparatus of claim 1, comprising:
   a third switch controlled by the retention signal, wherein the third switch is inoperative in the standby power mode, wherein the first switch is closed and the third switch is open during an active power mode.

8. The data retention apparatus of claim 1, wherein an area overhead associated with the first switch and the second switch is approximately 10% greater compared to a flip-flop without data retention.

9. The data retention apparatus of claim 7, wherein the first switch and the third switch are inoperable during the standby power mode.

10. The data retention apparatus of claim 7, wherein an area overhead associated with the first switch, the second switch and the third switch is approximately 15% greater compared to a flip-flop without data retention.

11. The data retention apparatus of claim 1, wherein the clock output is released from the predefined voltage level in response to another change in the retention signal.

12. The device of claim 1, included in a logic component wherein the logic component includes one of a microprocessor, a digital signal processor, a radio frequency chip, a memory and a microcontroller.

13. The device of claim 1, wherein an area overhead associated with the data retention component is approximately 10% greater compared to a flip-flop without data retention.

* * * * *